(12) United States Patent
Shima

(10) Patent No.: US 9,191,056 B2
(45) Date of Patent: *Nov. 17, 2015

(54) PLL CIRCUIT, CALIBRATION METHOD, AND WIRELESS COMMUNICATION APPARATUS

(71) Applicant: Panasonic Corporation, Osaka (JP)

(72) Inventor: Takahiro Shima, Kanagawa (JP)

(73) Assignee: PANASONIC CORPORATION, Osaka (JP)

( * ) Notice: Subject to any disclaimer, the term of this patent is extended or adjusted under 35 U.S.C. 154(b) by 22 days.

This patent is subject to a terminal disclaimer.

(21) Appl. No.: 14/123,905

(22) PCT Filed: Mar. 13, 2013

(86) PCT No.: PCT/JP2013/001680
§ 371 (c)(1),
(2) Date: Dec. 4, 2013

(87) PCT Pub. No.: WO2013/140755
PCT Pub. Date: Sep. 26, 2013

(65) Prior Publication Data
US 2014/0120847 A1   May 1, 2014

(30) Foreign Application Priority Data
Mar. 21, 2012   (JP) .................................. 2012-064339

(51) Int. Cl.
*H04B 1/40*   (2015.01)
*G06F 1/08*   (2006.01)
*H03K 23/66*   (2006.01)
(Continued)

(52) U.S. Cl.
CPC .. *H04B 1/40* (2013.01); *G06F 1/08* (2013.01); *H03K 23/66* (2013.01); *H03L 7/08* (2013.01); *H03L 7/18* (2013.01)

(58) Field of Classification Search
None
See application file for complete search history.

(56) References Cited

U.S. PATENT DOCUMENTS

| 7,856,212 B2 | 12/2010 | Pellerano et al. |
| 2008/0238495 A1 | 10/2008 | Tachibana et al. |
| 2009/0042528 A1* | 2/2009 | Pellerano et al. ............. 455/260 |

(Continued)

FOREIGN PATENT DOCUMENTS

JP   2008-236557 A   10/2008

OTHER PUBLICATIONS

Takahiro Shima, "A study on a Calibration Algorithm of CMOS Injection Locked Frequency Divider for a Short-range Wireless System", Proceedings of the 2011 IEICE Electronics Society Conference 2, Aug. 30, 2011, p. 102.

(Continued)

*Primary Examiner* — Alejandro Rivero
(74) *Attorney, Agent, or Firm* — Pearne & Gordon LLP

(57) ABSTRACT

An ILFD control unit sets a control parameter of an injection locked frequency divider based on each frequency of a reference signal and a frequency-divided signal measured in response to the control parameter of the injection locked frequency divider, in a stop state of a VCO and an injection locked frequency divider. The ILFD control unit runs the injection locked frequency divider and sets a control parameter of the injection locked frequency divider based on each frequency of the reference signal and the frequency-divided signal measured in response to the control parameter of the injection locked frequency divider, in the stop state of the VCO.

17 Claims, 11 Drawing Sheets

(51) Int. Cl.
*H03L 7/08* (2006.01)
*H03L 7/18* (2006.01)

(56) References Cited

U.S. PATENT DOCUMENTS

2009/0079506 A1* 3/2009 Wu et al. .................. 331/11
2009/0206894 A1* 8/2009 Wang et al. .............. 327/157
2010/0171535 A1* 7/2010 Shanan ..................... 327/157

OTHER PUBLICATIONS

Takahiro Shima, et al., A 60GHz CMOS PLL Synthesizer using a Wideband Injection-Locked Frequency Divider with Fast Calibration Technique, Asia-Pacific Microwave Conference Proceedings, 2011, Dec. 5, 2011, p. 1530-1533.

Pierre Mayr, et al., 13 GHz Cascaded 4:1 CMOS Injection-Locked Frequency Divider, Asia-Pacific Microwave Conference, 2006, Dec. 12, 2006, p. 520-523.

Masashi Kobayashi, "A 60GHz CMOS IC for a short-range wireless system—Frontend IC-", Proceedings of the 2011 IEICE General Conference Electronics 2, Feb. 28, 2011, p. 92.

Pierre Mayr, et al., A 90 GHz 65nm CMOS Injection-Locked Frequency Divider, Digest of Technical Papers. IEEE International Solid-State Circuits Conference, 2007, Feb. 11, 2007, p. 198-199, 596.

International Search Report for Application PCT/JP2013/001680 dated Apr. 23, 2013.

* cited by examiner

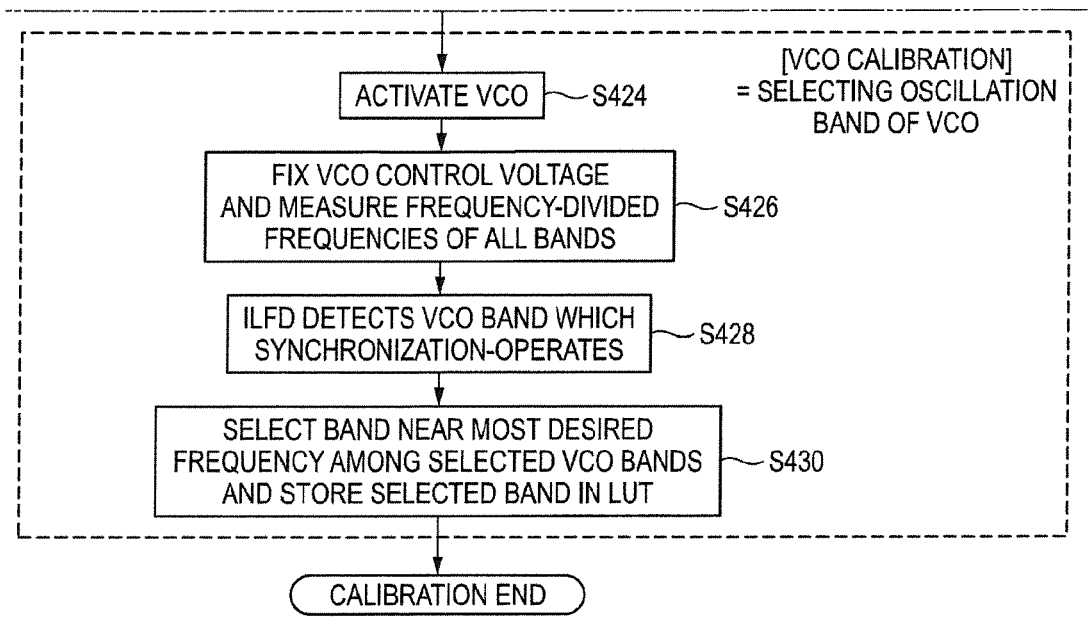

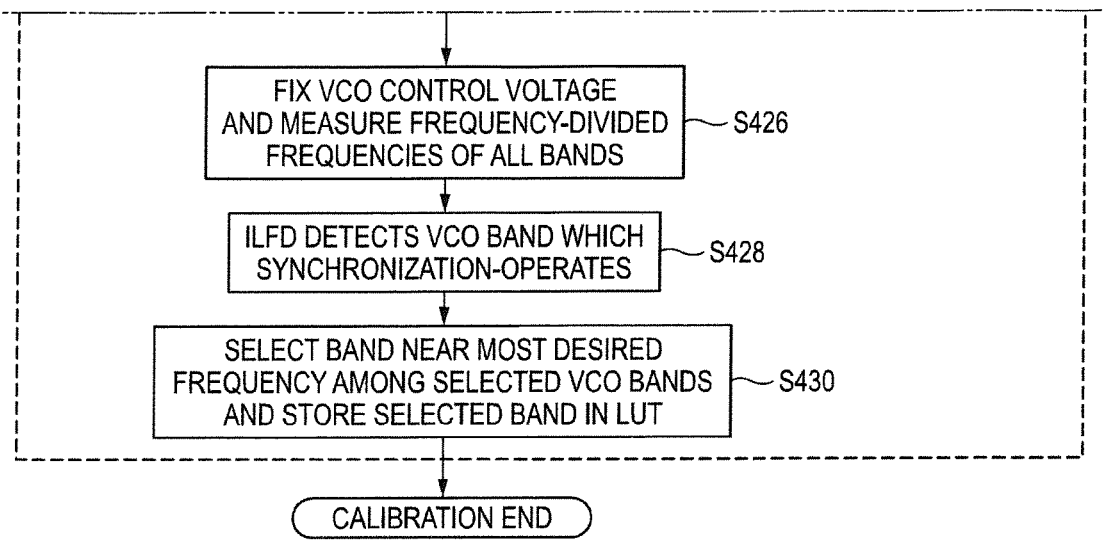

PLL CIRCUIT, CALIBRATION METHOD, AND WIRELESS COMMUNICATION APPARATUS

TECHNICAL FIELD

The present disclosure relates to a PLL circuit using a plurality of injection locked frequency dividers, a calibration method and a wireless communication apparatus.

BACKGROUND ART

Recently, prevalent portable wireless communication apparatuses have required fast throughput, and a Phase Locked Loop (PLL) circuit operating at a high frequency band has been required as a frequency synthesizer in wireless communication.

The PLL circuit includes a frequency divider which frequency-divides a high frequency band signal to a low frequency band signal. An injection locked frequency divider (ILFD) capable of high speed operation at a high frequency band of 10 GHz or more using low power consumption is used as a frequency divider.

CITATION LIST

Patent Literature

[Patent Literature 1] U.S. Pat. No. 7,856,212

SUMMARY OF THE INVENTION

Technical Problem

However, in Patent Literature 1 described above, a calibration method of a PLL circuit which is used by being connected to a plurality of injection locked frequency dividers is not assumed.

The present disclosure is made in view of the above-described circumstances of the related art, and aims to provide a PLL circuit which stably obtains a desired frequency and enables a plurality of injection locked frequency dividers to operate within respective locking ranges, a calibration method and a wireless communication apparatus.

Solution to Problem

The present disclosure provides a PLL circuit including: a voltage controlled oscillator that outputs a high frequency signal; a first injection locked frequency divider that frequency-divides the output high frequency signal; a second injection locked frequency divider that frequency-divides the signal frequency-divided by the first injection locked frequency divider; a frequency divider that frequency-divides a signal which is frequency-divided by the second injection locked frequency divider to frequency of a reference signal; a phase and frequency detector that compares a frequency-divided signal output from the frequency divider with the reference signal and outputs errors of phase and frequency; a charge pump that converts the output errors of the phase and frequency into an electric current; a loop filter that generates a control voltage of the voltage controlled oscillator in response to the converted electric current and applies the generated control voltage to the voltage controlled oscillator; and a calibration circuit that adjusts an oscillation band setting an oscillation frequency of the voltage controlled oscillator and control parameters for operating the first and second injection locked frequency dividers in predetermined operation bands different from each other. The calibration circuit adjusts the control parameter of the first injection locked frequency divider by adjusting the control parameter of the second injection locked frequency divider, and thereafter adjusts the oscillation band of the voltage controlled oscillator in response to the adjusted frequency-divided signal of the second injection locked frequency divider.

In addition, the present disclosure provides a calibration method of a PLL circuit that connects with a first injection locked frequency divider and a second injection locked frequency divider, the calibration method including: a step of stopping each operation of a voltage controlled oscillator outputting a high frequency signal and the first injection locked frequency divider; a step of measuring each frequency of a predetermined reference signal and a frequency-divided signal which is frequency-divided by a frequency divider in response to a control signal including a control parameter of the second injection locked frequency divider; a step of setting the control parameter of the second injection locked frequency divider, based on each frequency of the measured frequency-divided signal and the reference signal; a step of releasing the stop of the first injection locked frequency divider; a step of measuring each frequency of the predetermined reference signal and the frequency-divided signal which is frequency-divided by the second injection locked frequency divider and the frequency divider in response to the control signal including the control parameter of the first injection locked frequency divider; a step of setting the control parameter of the first injection locked frequency divider, based on each frequency of the measured frequency-divided signal and the reference signal; a step of releasing the stop of the voltage controlled oscillator; a step of selecting an oscillation band setting an oscillation frequency of the voltage controlled oscillator; and a step of selecting the oscillation band of the voltage controlled oscillator based on each frequency of the reference signal and the frequency-divided signal which is obtained by frequency-dividing a signal output from the voltage controlled oscillator by using the first and second injection locked frequency dividers and the frequency divider in response to the selected oscillation band.

In addition, the present disclosure provides a wireless communication apparatus including: a PLL circuit according to any one of those described above; a modulation unit that modulates a base band transmission signal; a transmission mixer that frequency-converts into a carrier frequency based on a first local signal output by the PLL circuit and the modulated transmission signal; a reception mixer that frequency-converts into a base band based on a second local signal output by the PLL circuit and a reception signal; and a demodulation unit that demodulates the frequency-converted reception signal.

Advantageous Effects of Invention

According to the present disclosure, a plurality of injection locked frequency dividers can be operated within a locking range, respectively, and it is possible to stably obtain a desired frequency.

DESCRIPTION OF EMBODIMENTS (Background Leading to the Contents of the Respective Embodiments)

First, before respective embodiments of a PLL circuit, a calibration method and a wireless communication apparatus according to the present disclosure are described, Patent Literature 1 will be described as the background leading to the contents of the respective embodiments.

In order to operate an injection locked frequency divider in a narrow locking range (operation band) and a wide frequency band, a calibration method of controlling the locking range in accordance with a desired frequency is required (for example, refer to Patent Literature 1).

Figure 7:
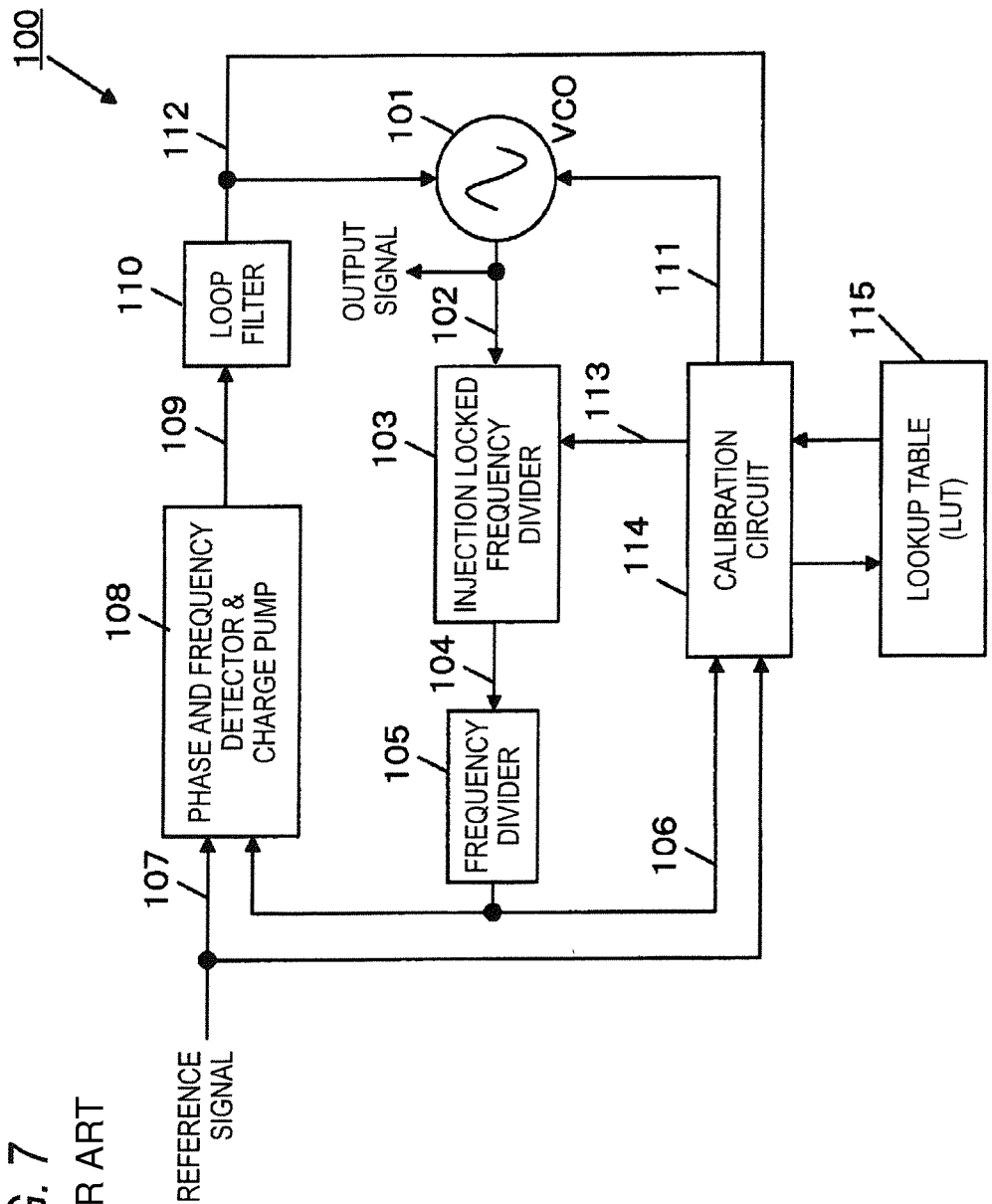
FIG. 7 is a circuit diagram of a PLL circuit of the related art using an injection locked frequency divider.

FIG. 7 illustrates a circuit configuration diagram of a PLL circuit of the related art (Patent Literature 1) using the injection locked frequency divider.

Figure 8:
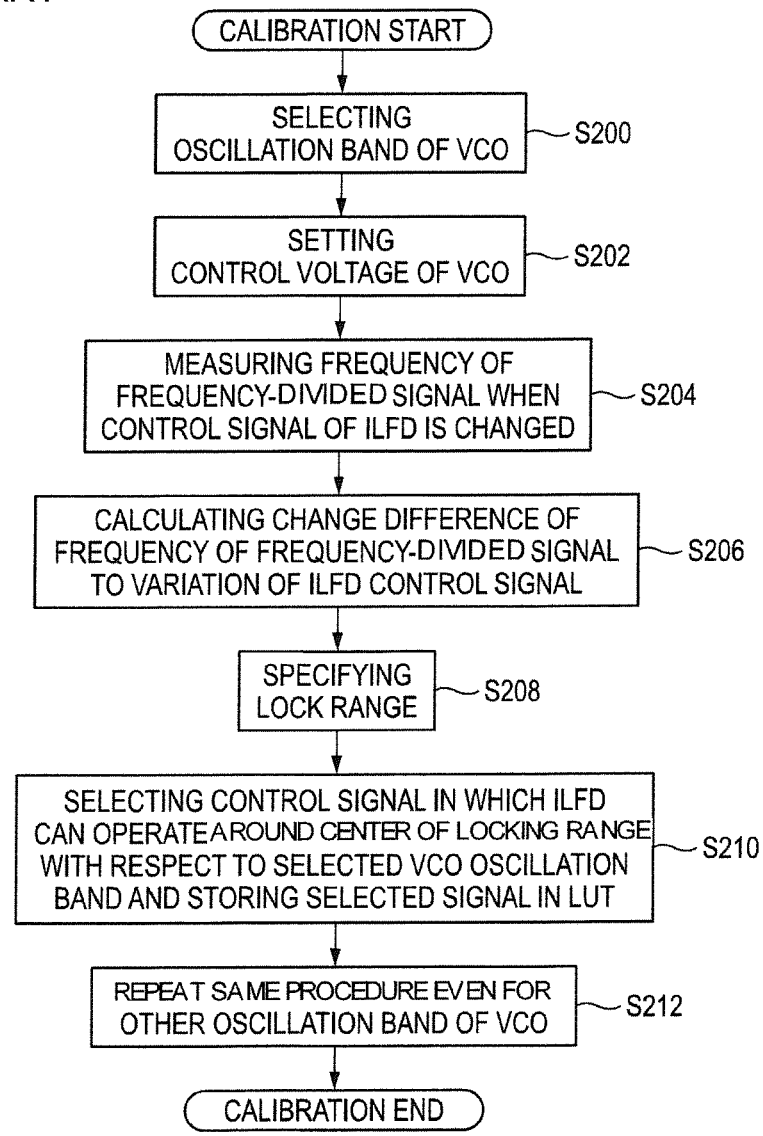
FIG. 8 is a flow chart in which a calibration of the PLL circuit of the related art using the injection locked frequency divider is described.

FIG. 8 is a flow chart in which a calibration of the PLL circuit of the related art (Patent Literature 1) using the injection locked frequency divider is described.

The PLL circuit 100 illustrated in FIG. 7 includes a voltage controlled oscillator (VCO) 101, the injection locked frequency divider 103, a frequency divider 105, a phase and frequency detector & charge pump 108, a loop filter 110, a calibration circuit 114, and a lookup table 115. Hereinafter, the voltage controlled oscillator is simply expressed as "VCO".

In the PLL circuit 100, an output signal 102 generated by an oscillation of the VCO 101 is injected (input) into the injection locked frequency divider 103, and frequency-divided to a lower frequency signal 104 of about 10 GHz. The frequency signal 104 is input to the frequency divider 105 and frequency-divided to the frequency of a reference signal 107 by the frequency divider 105.

The phase and frequency detector & charge pump 108 compares an output signal (frequency-divided signal 106) from the frequency divider 105 with the reference signal 107, and converts respective error components of phase and frequency into an electric current 109. The electric current 109 is input to the loop filter 110. The loop filter 110 generates a control voltage 112 of the VCO 101 in response to the input electric current 109.

The control voltage 112 decreases errors detected by the phase and frequency detector & charge pump 108 by controlling the VCO 101. Thereby, the PLL circuit 100 operates as a frequency negative feedback circuit.

The calibration circuit 114 adjusts (calibrates) a control value of a control signal 113 of the injection locked frequency divider 103 under an oscillation band of the VCO 101, by using the reference signal 107 and a frequency-divided signal 106 output from the frequency divider 105. By means of the control signal 113, the injection locked frequency divider 103 can operate around the center of the locking range (operation frequency band) of the injection locked frequency divider 103.

A calibration procedure of the PLL circuit 100 will be described by referring to FIGS. 7 and 8.

The calibration circuit 114 selects the oscillation band of the VCO 101 using a band selection signal 111 (S200). The band selection signal 111 is output from the calibration circuit 114.

The calibration circuit 114 sets the control voltage 112 of the VCO 101 (S202). For example, the calibration circuit 114 sets a predetermined value (for example, Vdd/2) as the control voltage 112.

The calibration circuit 114 measures the frequency of the frequency-divided signal 106 in a case where the control value of the control signal 113 of the injection locked frequency divider 103 is varied (S204).

The calibration circuit 114 calculates a variation difference of the frequency of the frequency-divided signal 106 with respect to the variation of the control value of the control signal 113 of the injection locked frequency divider 103 (S206).

The calibration circuit 114 specifies the locking range of the injection locked frequency divider 103 with respect to the oscillation band of the VCO 101 which is selected in step S200, based on a calculation result of step S206 (S208).

The calibration circuit 114 selects the control value of the control signal 113 by which the injection locked frequency divider 103 is operable around the center of the locking range, under an oscillation band of the selected VCO 101, based on a confirmation result of step S208 (S210). The calibration circuit 114 stores in the lookup table 115 the control value of the control signal 113 which is selected in step 210.

The calibration circuit 114 selects another oscillation band in the VCO 101 and repeats the operations of steps 202 to 210 (S212). Thereby, the PLL circuit 100 can store in the lookup table 115 the control value of the optimal control signal 113 of the injection locked frequency divider 103 with respect to each of a plurality of oscillation bands of the VCO 101.

In order to increase the frequency of the VCO in the PLL circuit or reduce power consumption of the PLL circuit, connecting a plurality of injection locked frequency dividers with one another and using the connected plurality of injection locked frequency dividers is effective.

First, in order to reduce the power consumption of the PLL circuit, problems in a case where the above-described plurality of injection locked frequency dividers which are connected with one another in the related art are used in the PLL circuit will be described by referring to FIG. 9. For example, the injection locked frequency divider (ILFD) 1 and the injection locked frequency divider (ILFD) 2 which have respective different locking ranges are used as the plurality of injection locked frequency dividers.

Figure 9:
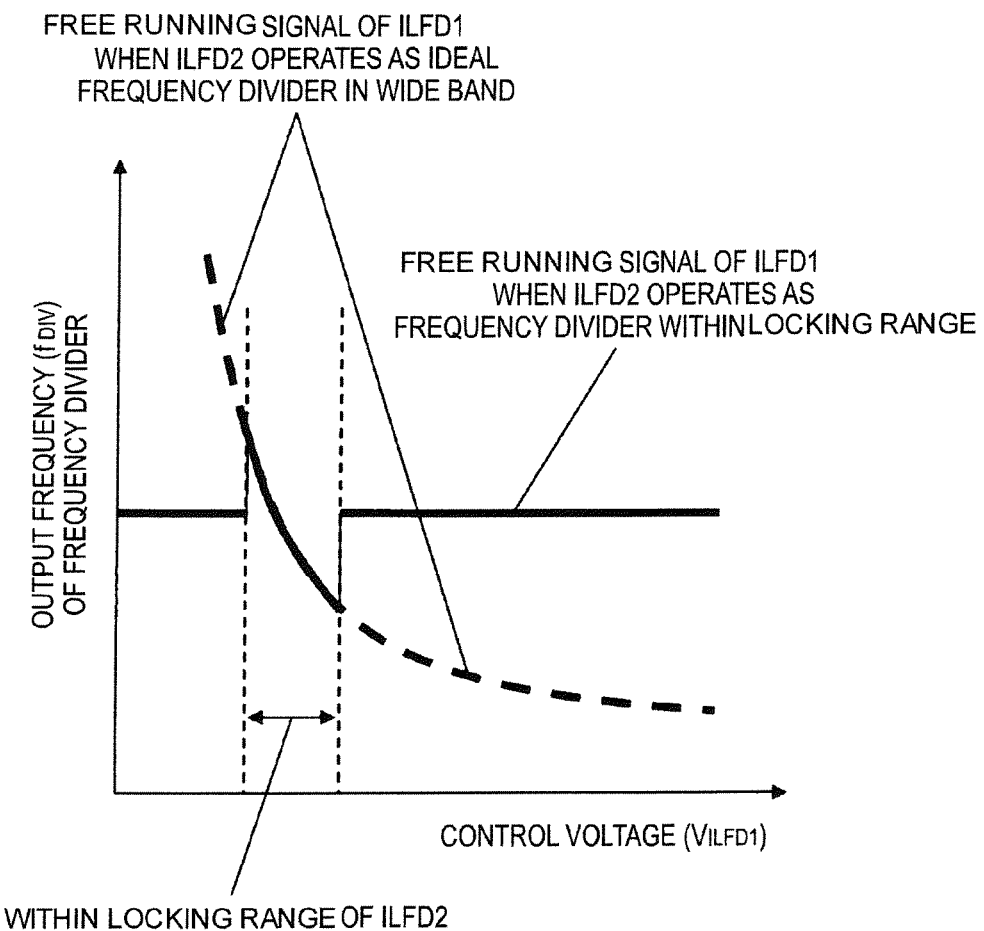
FIG. 9 is a graph illustrating a free running signal of an injection locked frequency divider 1 in a case where an injection locked frequency divider 2 in the next stage operates as an ideal frequency divider in a wide band, and the free running signal of the injection locked frequency divider 1 in a case where the injection locked frequency divider 2 operates as a certain general injection locked frequency divider which is within a locking range.

FIG. 9 is a graph illustrating a free running signal of the injection locked frequency divider 1 in a case where the injection locked frequency divider 2 in the next stage operates as an ideal frequency divider in a wide band and illustrating the free running signal of the injection locked frequency divider 1 in a case where the injection locked frequency divider 2 operates as the frequency divider within the locking range. A horizontal axis in FIG. 9 denotes the control voltage ($V_{IFLD1}$) of the injection locked frequency divider 1 and a vertical axis in FIG. 9 denotes the frequency ($f_{DIV}$) of the output signal of the frequency divider connected to the injection locked frequency divider 2.

The injection locked frequency dividers 1 and 2 have predetermined locking ranges, namely, operation frequency bands and operate as frequency dividers which frequency-divide the input (injection) signals within the locking range. In addition, the injection locked frequency dividers 1 and 2 do not operate as the frequency dividers in a range other than the locking range, and operate as oscillators which output the free running signals with a predetermined frequency.

A thick dashed line illustrated in FIG. 9 denotes an output frequency obtained after the free running signal with respect to the control voltage ($V_{ILFD1}$) of the injection locked frequency divider 1 is frequency-divided to the neighborhood of the reference signal frequency by means of the frequency divider, in a case where the injection locked frequency divider 2 in the next stage operates as the ideal injection locked frequency divider in the wide band. A thick solid line denotes an output frequency obtained after the free running signal of the injection locked frequency divider 1 is frequency-divided to the neighborhood of the reference signal frequency by means of the frequency divider, in a case where the injection locked frequency divider 2 operates as the frequency divider within the locking range. In addition, the free running signal is an oscillation signal which is not synchronous to the input signal.

In FIG. 9, in the calibration method of the PLL circuit in which the plurality of injection locked frequency dividers are connected with one another, the injection locked frequency divider 2 does not perform a synchronization-operation in the range other than the locking range of the injection locked frequency divider 2, namely, does not operate as the frequency divider. For this reason, in the range other than the locking range of the injection locked frequency divider 2, the free running signal output from the injection locked frequency divider 1 is not correctly divided in the injection locked frequency divider 2, and a signal with wrong frequency is output (refer to a linear portion of the thick solid line in FIG. 9).

Thus, in the calibration method of the PLL circuit in which the plurality of injection locked frequency dividers are connected with one another, there is a problem that the PLL circuit needs to control the free running signal output from the injection locked frequency divider 1 in the previous stage so as to operate within the locking range of the injection locked frequency divider 2 in the next stage.

Therefore, in each embodiment below, examples of the PLL circuit in which the plurality of injection locked frequency dividers operate within the respective locking ranges and in which a desired frequency is stably obtained, a calibration method and a wireless communication apparatus will be described.

Hereinafter, embodiments of the PLL circuit according to the present disclosure will be described by referring to the drawings. In addition, the present disclosure can express processing (steps) of the calibration circuit in the PLL circuit as the calibration method. Furthermore, the present disclosure can be expressed as the wireless communication apparatus which includes the PLL circuit as a local signal source.

(First Embodiment)

Figure 1:
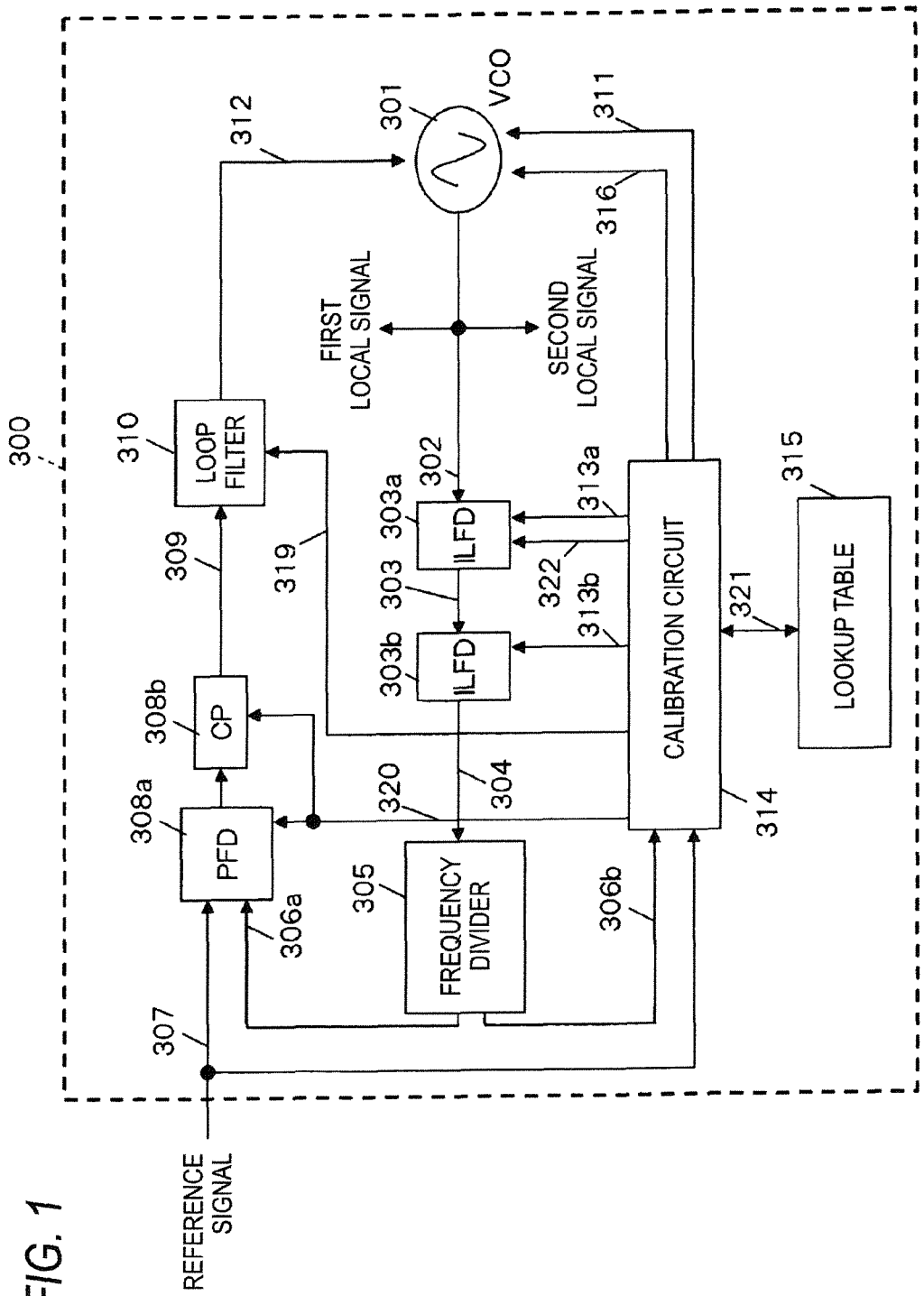
FIG. 1 is a block diagram illustrating an internal configuration of a PLL circuit according to a first embodiment.
Figure 2:
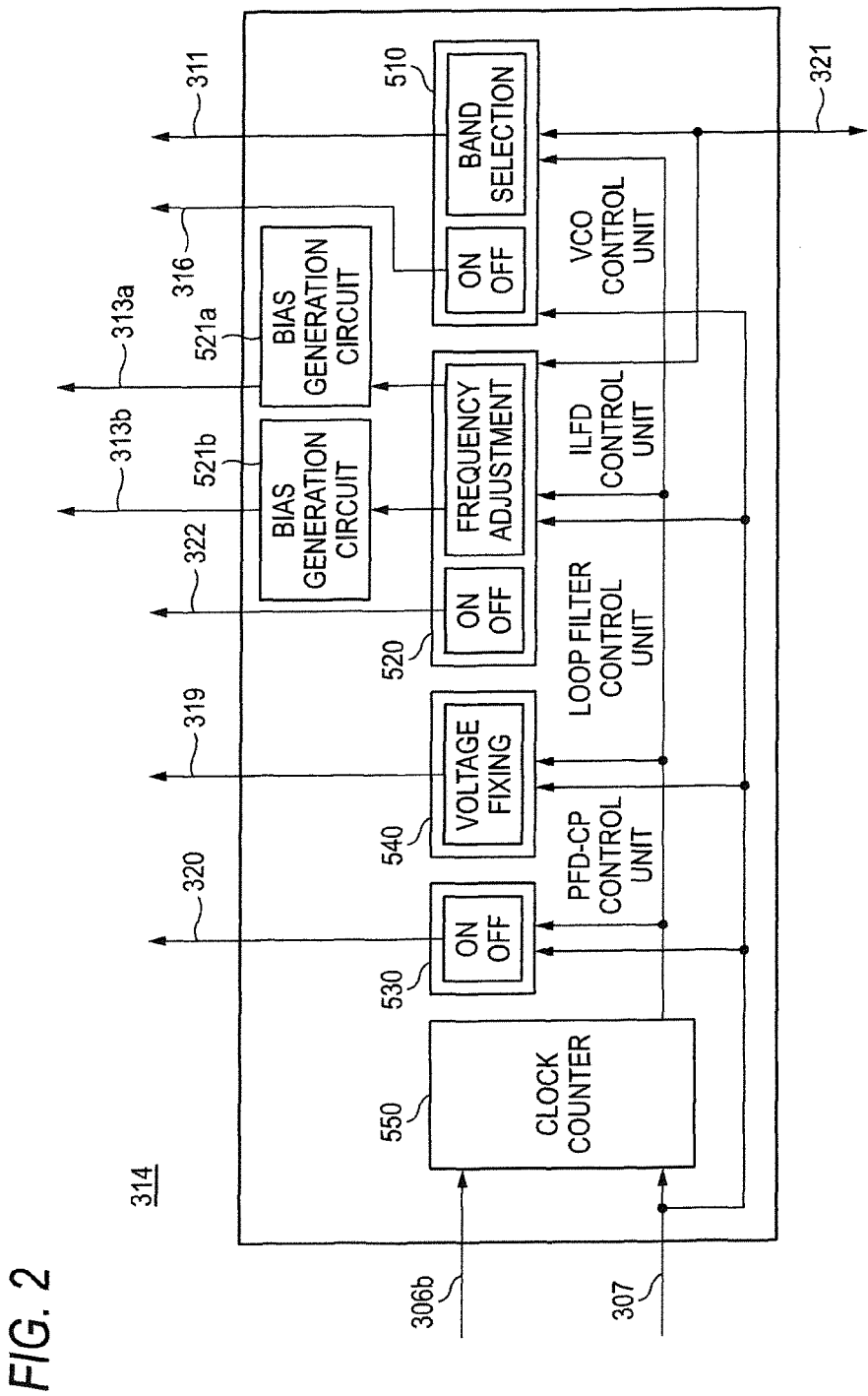
FIG. 2 is a block diagram illustrating an internal configuration of a calibration of the PLL circuit according to the first embodiment.

FIG. 1 is a block diagram illustrating an internal configuration of a PLL circuit 300 according to a first embodiment. FIG. 2 is a block diagram illustrating an internal configuration of a calibration circuit 314 in the PLL circuit 300 according to the first embodiment.

The configuration of the PLL circuit will be described.

The PLL circuit 300 illustrated in FIG. 1 includes an voltage controlled oscillator (VCO) 301, an injection locked frequency divider 303a, an injection locked frequency divider 303b, a frequency divider 305, a phase and frequency detector 308a (PFD: phase and frequency detector), a charge pump (CP: charge pump) 308b, a loop filter 310, a calibration circuit 314, and a lookup table 315.

In addition, in the PLL circuit 300, the phase and frequency detector 308a and the charge pump 308b are separately configured, but an example in which they are integrally configured is illustrated in FIG. 7.

An operation of the PLL circuit 300 will be described.

The voltage controlled oscillator (VCO) 301 operates (runs) as a voltage controlled oscillator or stops the running of the voltage controlled oscillator, in response to an input of a VCO on-off signal 316 which is output from the calibration circuit 314.

For example, when the content of the VCO on-off signal 316 is "activate the VCO 301", the VCO 301 runs as the voltage controlled oscillator in response to the input of the VCO on-off signal 316.

For example, when the content of the VCO on-off signal 316 is "deactivate the VCO 301", the VCO 301 stops the running as the voltage controlled oscillator in response to the input of the VCO on-off signal 316.

While running as the voltage controlled oscillator, the VCO 301 oscillates in accordance with an oscillation frequency characteristic based on an oscillation band which is selected in response to a control voltage 312 output from the loop filter 310 and a band selection signal 311 output from the calibration circuit 314.

Figure 3:
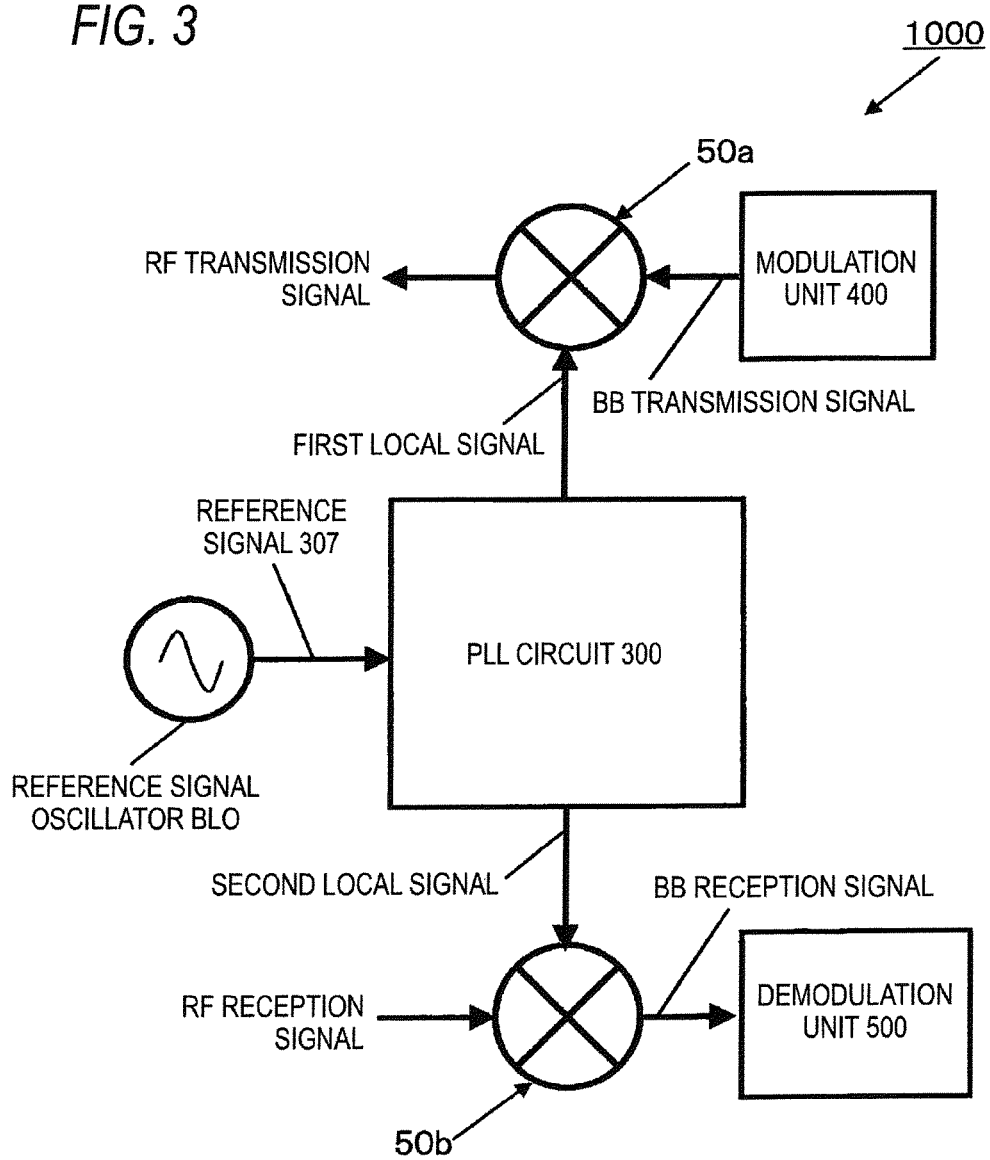
FIG. 3 is a block diagram illustrating a configuration of a wireless communication apparatus including the PLL circuit according to the first embodiment.

The VCO 301 outputs an output signal of high frequency to the injection locked frequency divider (ILFD) 303a by means of the oscillation of the oscillation frequency. In addition, the output signal of high frequency 302 is input to each of a transmission mixer 50a and a reception mixer 50b as a first local signal and a second local signal which are illustrated in FIG. 3.

The injection locked frequency divider 303a in the previous stage corresponds to the injection locked frequency divider (ILFD) 1 described in FIG. 9, functions as a frequency divider in synchronization with the input (injection) of the output signal 302 from the VCO 301, and frequency-divides the output signal 302 to a predetermined magnification, in response to the control signal (control voltage 313a) output from the calibration circuit 314. The injection locked frequency divider 303a outputs the frequency-divided signal 303 to the injection locked frequency divider 303b.

In addition, the control signal (control voltage 313a) denotes a control voltage for operating within the locking range of the injection locked frequency divider 2, namely, for operating the injection locked frequency divider 2 as a frequency divider.

The injection locked frequency divider 303b in the rear stage corresponds to the injection locked frequency divider 2 described in FIG. 9, functions as a frequency divider in synchronization with the input (injection) of the frequency-divided signal 303 output from the injection locked frequency divider 303a, and frequency-divides the frequency-divided signal 303 to a predetermined magnification, in response to the control signal (control voltage 313b) output from the calibration circuit 314. The injection locked frequency divider 303b outputs the frequency-divided signal 304 to the frequency divider 305.

In addition, the control signal (control voltage 313b) denotes a control voltage for operating within the locking range of the injection locked frequency divider 1, namely, for operating the injection locked frequency divider 1 as a frequency divider.

The frequency divider 305 receives the frequency-divided signal 304 output from the injection locked frequency divider 303b and frequency-divides the input frequency-divided signal 304 to a predetermined magnification. The frequency-divider 305 outputs the frequency-divided signal 306a to the phase and frequency detector (PFD) 308a and furthermore, outputs the frequency-divided signal 306b to the calibration circuit 314.

The phase and frequency detector 308a compares the frequency-divided signal 306a output from the frequency divider 305 with a reference signal 307 output from a reference signal oscillator BLO illustrated in FIG. 3. The phase and frequency detector 308a outputs respective error components of the phase and frequency of the frequency-divided signal 306a and the reference signal 307, which are obtained from the comparison result, to the charge pump 308b.

The charge pump 308b converts the respective error components of the phase and frequency output from the phase and frequency detector 308a into the electric current 309 and outputs the electric current 309 to the loop filter 310.

The loop filter 310 generates the control voltage of the VCO 301 in response to the electric current 309 output from the charge pump 308b. The loop filter 310 outputs (applies) the generated control voltage to the VCO 301.

The detailed configuration of the calibration circuit 314 will be described.

The calibration circuit 314 illustrated in FIG. 2 is configured to include a VCO control unit 510, an ILFD control unit 520, bias generation circuits 521a and 521b, a PFD-CP control unit 530, a loop filter control unit 540, and a clock counter 550.

The detailed operation of the calibration circuit 314 will be described. The reference signal 307 is input to each unit of the calibration circuit 314. The calibration circuit 314 operates based on the input reference signal 307.

The VCO control unit 510 controls running (activation) or stop (deactivation) of the VCO 301 which outputs the high frequency signal. The VCO control unit 510 outputs to the VCO 301 the VCO on-off signal 316 which activates the VCO 301 so as to activate the VCO 301. The VCO control unit 510 outputs the VCO on-off signal 316 to the VCO 301 which deactivates the VCO 301 so as to deactivate the VCO 301.

The VCO control unit 510 outputs the band selection signal 311 for selecting the oscillation band to the VCO 301, while the VCO 301 runs. The oscillation band sets the oscillation frequency characteristic of the VCO 301 in response to the control voltage 312.

The VCO control unit 510 selects the oscillation band (band selection signal 311) of the VCO 301 and stores the oscillation band (band selection signal 311) in the lookup table 315.

The ILFD control unit 520 controls the running (activation) or the stop (deactivation) of the injection locked frequency divider 303a. The ILFD control unit 520 outputs to the injection locked frequency divider 303a the ILFD on-off signal 322 which activates the injection locked frequency divider 303a so as to activate the injection locked frequency divider 303a. The ILFD control unit 520 outputs to the injection locked frequency divider 303a the ILFD on-off signal 322 which deactivates the injection locked frequency divider 303a so as to deactivate the injection locked frequency divider 303a.

The ILFD control unit 520 sets a control parameter (control voltage 313a) of the injection locked frequency divider 303a and stores the control parameter (control voltage 313a) in the lookup table 315.

The ILFD control unit 520 sets a control parameter (control voltage 313b) of the injection locked frequency divider 303b and stores the control parameter (control voltage 313b) in the lookup table 315.

The ILFD control unit 520 outputs to the bias generation circuits 521a and 521b respective control signals which include initial values of the control parameters for adjusting the oscillation frequencies of the injection locked frequency dividers 303a and 303b. The ILFD control unit 520 changes the control parameters for adjusting the frequencies of the frequency-divided signals of the injection locked frequency dividers 303a and 303b to desired frequency bands, in response to a measurement result of the clock counter 550. The ILFD control unit 520 outputs the respective control signals which include the changed control parameters to the bias generation circuits 521a and 521b.

In addition, in the ILFD control unit 520, the initial values of the control parameters are stored. For example, the initial values of the control parameters are values which are set so that the respective oscillation frequencies of the injection locked frequency dividers 303a and 303b can be positioned in the desired frequency bands.

For example, the bias generation circuits 521a and 521b are Digital Analog Converters (DAC), receive the control signal output from the ILFD control unit 520, and convert each of the input control signals into the oscillation frequency of the injection locked frequency dividers 303a and 303b or the control voltage of the frequency of the frequency-divided signal. The bias generation circuits 521a and 521b output (apply) each of the converted control voltages 313a and 313b to the injection locked frequency dividers 303a and 303b.

The PFD-CP control unit 530 controls running (activation) or stop (deactivation) of the phase and frequency detector 308a and the charge pump 308b. In order to activate the phase and frequency detector 308a and the charge pump 308b, the PFD-CP control unit 530 outputs the PFD-CP on-off signal 320 as the activation to the phase and frequency detector 308a and the charge pump 308b.

In order to deactivate the phase and frequency detector 308a and the charge pump 308b, the PFD-CP control unit 530 outputs the PFD-CP on-off signal as the deactivation to the phase and frequency detector 308a and the charge pump 308b.

The loop filter control unit 540 generates the control signal 319 for switching the control voltage 312 which is supplied to the VCO 301 and outputs the control signal 319 to the loop filter 310. Specifically, the loop filter control unit 540 outputs to the loop filter 310 the control signal 319 which determines whether to output the output (constant voltage) from the charge pump 308 as the control voltage 312 which is output as the output of the loop filter 310, through the loop filter 310, or to output a predetermined fixed value (for example, Vdd, Vdd/2) generated in the loop filter 310 as the control voltage 312 which is output as the output of the loop filter 310.

The clock counter 550 receives the reference signal 307, and the frequency-divided signal 306b obtained by frequency-dividing the frequency-divided signal 304 output from the injection locked frequency divider 303b using the frequency divider 305.

The clock counter 550 measures each frequency of the reference signal 307 and the frequency-divided signal 306 which are input. The output of the clock counter 550 is output to the VCO control unit 510, the ILFD control unit 520, the PFD-CP control unit 530 and the loop filter control unit 540.

For example, in a case where the frequency of the reference signal 307 is 100 MHz, the clock counter 550 counts the frequency-divided signal 306 of 110 clocks while the reference signal 307 of 100 clocks is counted. In this case, the frequency of the frequency-divided signal 306b becomes 110 MHz.

FIG. 3 is a schematic configuration diagram of a wireless communication apparatus 1000 which includes the PLL circuit 300 according to the first embodiment. The wireless communication apparatus 1000 is configured to include the reference signal oscillator BLO, the PLL circuit 300, the modulation unit 400, the transmission mixer 50a, the reception mixer 50b and a demodulation unit 500.

The PLL circuit 300 receives the output signal (reference signal 307) from the reference signal oscillator BLO and outputs each of the first and second local signals with desired frequencies to the transmission mixer 50a and the reception mixer 50b, based on the input reference signal 307. In addition, for example, the reference signal oscillator BLO can be configured by using a crystal unit.

The transmission mixer 50a receives a base band transmission signal modulated by the modulation unit 400 and the first local signal output by the PLL circuit 300. The transmission mixer 50a upconverts based on the transmission signal and the first local signal which are input and converts the base band transmission signal (BB transmission signal) into a high frequency transmission signal (RF transmission signal). In addition, the high frequency transmission signal is transmitted through an antenna which is not illustrated in FIG. 3.

The reception mixer 50b receives a high frequency reception signal (RF reception signal) received through the antenna which is not illustrated in FIG. 3 and the second local signal output by the PLL circuit 300. The reception mixer 50b downconverts by using the high frequency reception signal and the second local signal which are input and converts the high frequency reception signal into a base band reception signal (BB reception signal). In addition, the base band reception signal is demodulated onto the transmission signal by the demodulation unit 500.

Figure 4:
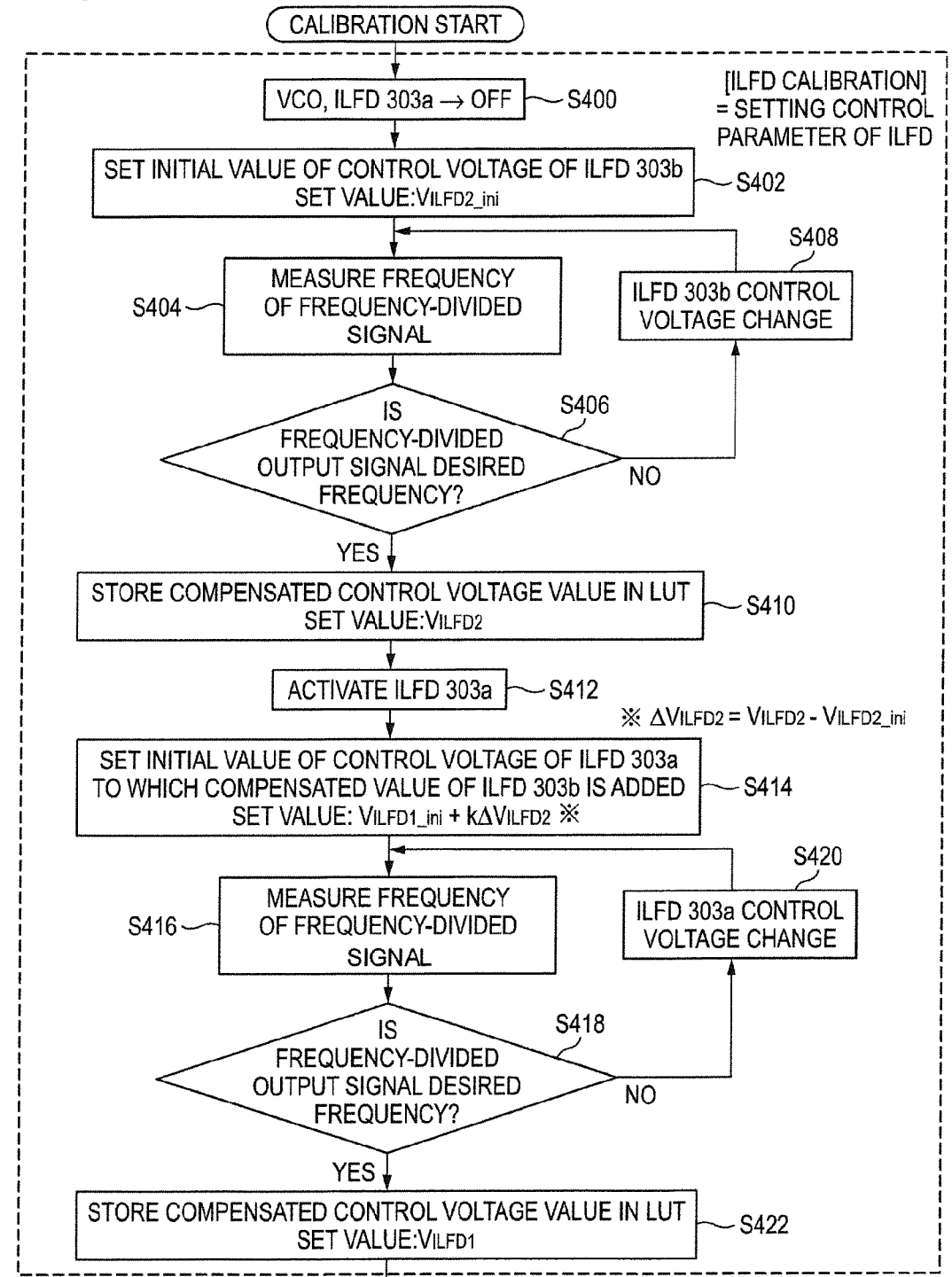
FIG. 4 is a flow chart in which an operation of a calibration circuit in the PLL circuit according to the first embodiment is described.

FIG. 4 is a flow chart for explaining an operation of the calibration circuit 314 in the PLL circuit 300 according to the first embodiment.

In steps S400 to S410, the calibration circuit 314 sets the calibration of the injection locked frequency divider 303b, namely, the control parameter of the injection locked frequency divider 303b.

In steps S412 to S422, the calibration circuit 314 sets the calibration of the injection locked frequency divider 303a, namely, the control parameter of the injection locked frequency divider 303a.

In steps S424 to S430, the calibration circuit 314 selects the calibration of the VCO 301, namely, the oscillation band of the VCO 301 for obtaining the output signal (first local signal and second local signal) of a desired frequency.

(Calibration of ILFD)

In FIG. 4, the VCO control unit 510 outputs the VCO on-off signal 316 for deactivating the VCO 301 to the VCO 301. The ILFD control unit 520 outputs the ILFD on-off signal 322 for deactivating the injection locked frequency divider 303a to the injection locked frequency divider 303a (S400). Thereby, the VCO 301 and the injection locked frequency divider 303a stop. Thus, since the injection locked frequency divider 303b is not synchronous to the output signal from the injection locked frequency divider 303a, the injection locked frequency divider 303b runs as the voltage controlled oscillator and not as the frequency divider.

The ILFD control unit 520 outputs to the bias generation circuit 521b the control signal which includes the initial value of the control parameter for adjusting the oscillation frequency of the injection locked frequency divider 303b. The bias generation circuit 521b converts the control signal output from the ILFD control unit 520 into the control voltage 313b of the oscillation frequency of the injection locked frequency divider 303b, and applies the control voltage 313b to the injection locked frequency divider 303b (S402). The control voltage value of the initial value of the injection locked frequency divider 303b is denoted as $V_{ILFD2\_ini}$.

In response to the control voltage 313b applied in step S402, the frequency-divided signal 306b which is obtained by frequency-dividing the output signal generated by the oscillation of the injection locked frequency divider 303b, using the injection locked frequency divider 303b and the frequency divider 305, and the reference signal 307 are input to the clock counter 550.

The clock counter 550 receives the reference signal 307 and the frequency-divided signal 306b obtained by frequency-dividing the frequency-divided signal 304 output from the injection locked frequency divider 303b using the frequency divider 305, and measures each frequency of the reference signal 307 and the frequency-divided signal 306b which are input (S304).

In a case where the frequency of the frequency-divided signal 306b is a preset desired frequency (S406, YES), the processing of the calibration circuit 314 proceeds to step S410. When the frequency of the reference signal 307 and the frequency of the frequency-divided signal 306b are predetermined amounts or less, the frequency of the frequency-divided signal 306b becomes the desired frequency. Namely, the ILFD control unit 520 stores the control parameter of the injection locked frequency divider 303b in the lookup table 315 (S410). Thereby, the calibration of the injection locked frequency divider 303b using the calibration circuit 314 is completed.

In a case where the frequency of the frequency-divided signal 306b is not the preset desired frequency (S406, NO), the processing of the calibration circuit 314 proceeds to step S408. Namely, ILFD control unit 520 changes the control parameter for adjusting the oscillation frequency of the injection locked frequency divider 303b to a desired frequency band, based on the output of the clock counter 550 (S408). The ILFD control unit 520 outputs to the bias generation circuit 521b the control signal which includes the changed control parameter.

Here, the desired frequency is the frequency within plus or minus a few percent with respect to the frequency of the reference signal 307. For example, in a case where the operation band (locking range) of the injection locked frequency divider 303b is a range of ±3 GHz around 60 GHz, an operational fractional bandwidth of the injection locked frequency divider 303b becomes ±5%.

This means that the injection locked frequency divider 303b performs normal operation (lock) if the operation frequency difference is within ±5% in the operational fractional bandwidth. Here, in a case where the reference signal 307 is 100 MHz, the injection locked frequency divider 303b performs a normal operation when the desired frequency is 95 to 105 MHz.

In response to the control voltage 313b applied in step S408, the frequency-divided signal 306b which is obtained by frequency-dividing the output signal generated by the oscillation of the injection locked frequency divider 303b, using the injection locked frequency divider 303b and the frequency divider 305, and the reference signal 307 are input to the clock counter 550.

After step S408 is implemented, steps S404, S406 and S408 are repeated, until the frequency of the frequency-divided signal 306b becomes the preset desired frequency.

Here, when the control voltage after the injection locked frequency divider 303b is compensated is $V_{ILFD2}$, the compensated value $\Delta V_{ILFD2}$ of the control voltage is denoted as a value obtained by subtracting the control voltage $V_{ILFD2\_ini}$ of the initial value from the compensated control voltage $V_{ILFD2}$.

After step S410 is implemented, the ILFD control unit 520 outputs to the injection locked frequency divider 303a the ILFD on-off signal 322 for activating the injection locked frequency divider 303a, so as to activate the injection locked frequency divider 303a (S412). Thereby, the injection locked frequency divider 303a runs as the voltage controlled oscillator not as the frequency divider, because the injection locked frequency divider 303a is not synchronous to the output signal from the VCO 301 while the VCO 301 is at a stop state.

Thus, in a case where the injection locked frequency divider 303b is synchronous to the output signal from the injection locked frequency divider 303a, the injection locked frequency divider 303b runs as the frequency divider for frequency-dividing the output signal from the injection locked frequency divider 303a.

The ILFD control unit 520 outputs to the bias generation circuit 521a the control signal which includes the initial value of the control parameter for adjusting the oscillation frequency of the injection locked frequency divider 303a. Here, the control voltage of the initial value of the injection locked frequency divider 303a is denoted as $V_{ILFD1\_ini}$. The ILFD control unit 520 sets the value obtained by adding the compensated value $\Delta V_{ILFD1}$ of the injection locked frequency divider 303b to the control voltage $V_{ILFD1\_ini}$ of the initial value as the set value of the control voltage. For example, the ILFD control unit 520 sets $V_{ILFD1\_ini}+k\Delta V_{ILFD2}$ as the set value of the control voltage of the injection locked frequency divider 303a. A character "k" is an adjustment coefficient, for example, 0.95 to 1.05.

In a case where each circuit configuration of the injection locked frequency dividers 303a and 303b is the same, the compensated value of the control voltage becomes roughly equivalent by means of change of conditions which include process variation, a power supply voltage or ambient temperature, in the injection locked frequency dividers 303a and 303b. Thus, by adding the compensated value of control voltage obtained by calibration of the injection locked frequency divider 303b to the initial value of the control voltage of the injection locked frequency divider 303a, the injection locked frequency divider 303a can perform an initial operation within the locking range of the injection locked frequency divider 303b.

The bias generation circuit 521a converts the control signal output from the ILFD control unit 520 into the control voltage 313a of the oscillation frequency of the injection locked frequency divider 303a and applies the control voltage 313a to the injection locked frequency divider 303a (S414).

In response to the control voltage 313a applied in step S414, the frequency-divided signal 306b which is obtained by frequency-dividing the output signal generated by the oscillation of the injection locked frequency divider 303a, using the frequency divider 305, and the reference signal 307 are input to the clock counter 550.

The clock counter 550 receives the reference signal 307 and the frequency-divided signal 306b which is obtained by frequency-dividing the frequency-divided signal 304 output from the injection locked frequency divider 303b, using the frequency-divider 305, and measures each frequency of the reference signal 307 and the frequency-divided signal 306b which are input (S416).

In a case where the frequency of the frequency-divided signal 306b is a preset desired frequency (S418, YES), the processing of the calibration circuit 314 proceeds to step S422. Namely, the ILFD control unit 520 stores the control parameter of the injection locked frequency divider 303a in the lookup table 315 (S422). A control voltage value of the injection locked frequency divider 303a is denoted as $V_{ILFD1}$. Thereby, the calibration of the injection locked frequency divider 303a using the calibration circuit 314 is completed.

In a case where the frequency of the frequency-divided signal 306b is not the preset desired frequency (S418, NO), the processing of the calibration circuit 314 proceeds to step S420. Namely, the ILFD control unit 520 changes the control parameter for adjusting the oscillation frequency of the injection locked frequency divider 303a to a desired frequency band, based on the output of the clock counter 550 (S420). The ILFD control unit 520 outputs the control signal including the changed control parameter to the bias generation circuit 521a.

In response to the control voltage 313a applied in step S408, the frequency-divided signal 306b which is obtained by frequency-dividing the output signal generated by the oscillation of the injection locked frequency divider 303a, using the injection locked frequency divider 303b and the frequency divider 305, and the reference signal 307 are input to the clock counter 550.

After step S420 is implemented, steps S416, S418 and S420 are repeated until the frequency of the frequency-divided signal 306b becomes the preset desired frequency.

(Calibration of VCO)

After step S422 is implemented, the VCO control unit 510 outputs to the VCO 301 the VCO on-off signal 316 for activating the VCO 301, so as to activate the VCO 301 which is deactivated during the calibration of the injection locked frequency dividers 303a and 303b (S424). Thereby, the VCO 301 runs.

Thus, the injection locked frequency divider 303a runs as the frequency divider for frequency-dividing the output signal, in a case where the injection locked frequency divider 303a is synchronous to the output signal from the VCO 301.

The loop filter control unit 540 generates the control signal 319 for switching the control voltage 312 which is supplied to the VCO 301 and outputs the control signal 319 to the loop filter 310 by. Specifically, the loop filter control unit 540 outputs to the loop filter 310 the control signal 319 which determines whether to output the output (constant voltage) from the charge pump 308 as the control voltage 312 which is output as the output of the loop filter 310, through the loop filter 310, or to output a predetermined fixed value (for example, Vdd, Vdd/2) generated in the loop filter 310 as the control voltage 312 which is output as the output of the loop filter 310.

The VCO control unit 510 outputs to the VCO 301 the band selection signal 311 for selecting the oscillation band which sets the oscillation frequency characteristic of the VCO 301 responding to the control voltage 312 output from the loop filter 310 based on the fixed electric current 309 (S426).

The VCO 301 outputs to the injection locked frequency divider 303a the output signal 302 of the oscillation frequency responding to the control voltage 312, in accordance with the oscillation band responding to the band selection signal 311 which is output from the VCO control unit 510.

The injection locked frequency divider 303a frequency-divides the output signal 302 to a predetermined magnification in synchronization with the input of the output signal 302 from the VCO 301, based on the control voltage 313a responding to the control parameter which is stored in step S422. The injection locked frequency divider 303a outputs the frequency-divided signal 303 to the injection locked frequency divider 303b.

The injection locked frequency divider 303b frequency-divides the frequency-divided signal 303 to a predetermined magnification in synchronization with the input of the frequency-divided signal 303 output from the injection locked frequency divider 303a, based on the control voltage 313b responding to the control parameter which is stored in step S410. The injection locked frequency divider 303b outputs the frequency-divided signal 304 to the frequency divider 305.

The frequency divider 305 frequency-divides the frequency-divided signal 304 output from the injection locked frequency divider 303b to a predetermined magnification, outputs the frequency-divided signal 306a to the phase and frequency detector 308a and, further, outputs the frequency-divided signal 306b to the clock counter 550.

The clock counter 550 receives the reference signal 307 and the frequency-divided signal 306b which is frequency-divided by the frequency divider 305, and measures each frequency of the reference signal 307 and the frequency-divided signal 306b which are input. The same manipulation is performed in the all oscillation bands, and the frequency is measured (S426).

From the frequencies of all the oscillation bands which are measured in step S426, the oscillation band in which the injection locked frequency divider performs the synchronization-operation within the locking range is detected (S428).

In the oscillation band detected in step S428, the oscillation band in which the frequency of the frequency-divided signal 306b is near the most desired frequency is stored in the lookup table 315 (S430). Thereby, the calibration of the VCO 301 is completed.

After step S430 is implemented, the loop filter control unit 540 sets a predetermined fixed value generated in the internal portion in step S426 as an output of the loop filter 310, and generates a control signal 319 for supplying the control voltage 312 to the VCO 301. Thereby, the calibration of the VCO 301 using the calibration circuit 314 is completed.

Thus, the PLL circuit 300 completes the calibration of setting the control parameter of the injection locked frequency dividers 303a and 303b using the calibration circuit 314 and selecting the oscillation band of the VCO 301.

Thereby, even in a case where the conditions including the process, the power supply voltage or the ambient temperature are varied, the PLL circuit 300 according to the first embodiment can operate the plurality of injection locked frequency dividers within the locking range, and it is possible to stably obtain the desired frequency by appropriately setting the oscillation band of the VCO 301.

In addition, by adding the compensated value of the control voltage of the injection locked frequency divider 303b as the initial value of the control voltage of the injection locked frequency divider 303a, the injection locked frequency divider 303a operates within the locking range of the injection locked frequency divider 303b. Thereby, the PLL circuit 300 can decrease the compensated amount of the injection locked frequency divider 303a, and can complete the calibration in a short time.

In addition, the VCO control unit 510 and the PFD-CP control unit 530 may stop the voltage controlled oscillator 301, the phase and frequency detector 308a and the charge pump 308b, during the calibration of the injection locked frequency dividers 303a and 303b in steps S400 to S422.

Thereby, the PLL circuit 300 can reduce power consumption during the calibration of the injection locked frequency dividers 303a and 303b in steps S400 to S422.

In the same manner, the PFD-CP control unit 530 may stop the phase and frequency detector 308a and the charge pump 308b during the calibration of the VCO 301 in steps S424 to S430.

Thereby, the PLL circuit 300 can reduce the power consumption during the calibration of the VCO 301 in steps S424 to S430.

(Second Embodiment)

Figure 5:
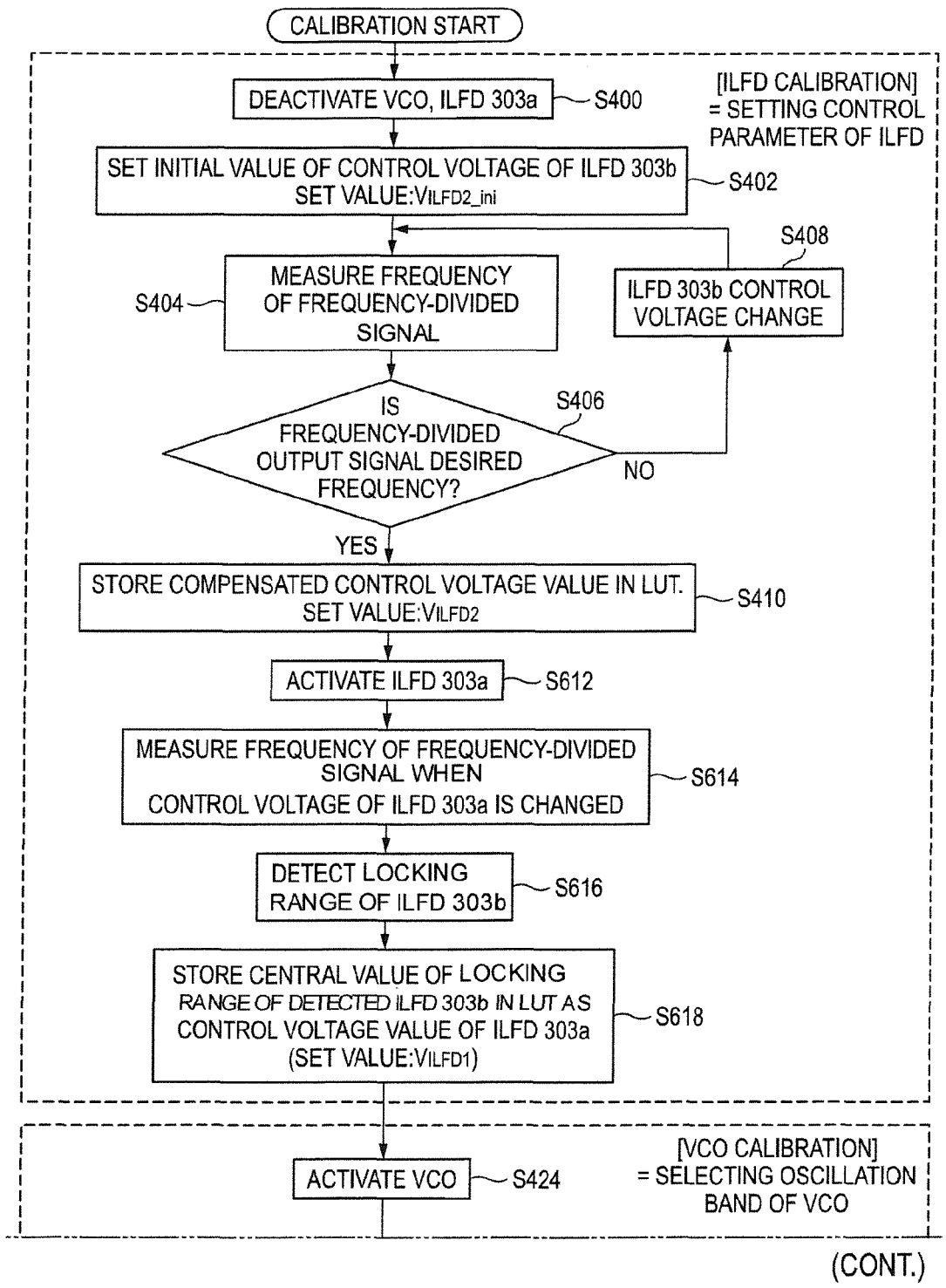
FIG. 5 is a flow chart in which an operation of a calibration circuit in a PLL circuit according to a second embodiment is described.

FIG. 5 is a flow chart for explaining the operation of the calibration circuit 314 according to a second embodiment. Since the configurations of the PLL circuit 300 and the calibration circuit 314 according to the second embodiment is the same as those according to the first embodiment, the description of the configurations will not be repeated. In addition, in FIG. 5, the same reference numerals are assigned to the constituent sections that are the same as those illustrated in FIG. 4 and their repeated descriptions are omitted.

The calibration circuit 314 sets the calibration of the injection locked frequency divider 303b in steps S612 to S618, namely the control parameter of the injection locked frequency divider 303b.

(Calibration of ILFD)

In FIG. 5, the calibration of the injection locked frequency divider 303b in steps S400 to S410, namely a setting procedure of the control parameter of the injection locked frequency divider 303b is the same as that of the first embodiment (refer to FIG. 4), and thus, their descriptions are omitted.

After step S410 is implemented, the ILFD control unit 520 outputs to the injection locked frequency divider 303a the ILFD on-off signal 322 for activating the injection locked frequency divider 303a, so as to activate the injection locked frequency divider 303a (S612). Thereby, the injection locked frequency divider 303a runs.

Thus, in a case where the injection locked frequency divider 303b is synchronous to the output signal from the injection locked frequency divider 303a, the injection locked frequency divider 303b runs as a frequency divider for frequency-dividing the output signal.

The ILFD control unit 520 outputs to the bias generation circuit 521b by continuously sweeping the control signal which includes the control parameter for adjusting the oscillation frequency of the injection locked frequency divider 303a. Namely, in the first embodiment, the initial value of the control voltage of the injection locked frequency divider 303a is set by using the compensated value of the injection locked frequency divider 303b which is calibrated, but in the second embodiment, the injection locked frequency divider 303a does not limit the range of the control voltage.

The bias generation circuit 521 converts the control signal output from the ILFD control unit 520 into the control voltage 313a of the oscillation frequency of the injection locked frequency divider 303a, and applies the control voltage 313a to the injection locked frequency divider 303a (S614).

In response to the control voltage 313a applied in step S614, the frequency-divided signal 306b which is obtained by frequency-dividing the output signal generated by the oscillation of the injection locked frequency divider 303a, using the injection locked frequency divider 303b and the frequency divider 305, and the reference signal 307 are input to the clock counter 550.

The clock counter 550 receives the reference signal 307 and the frequency-divided signal 306b which is obtained by frequency-dividing the frequency-divided signal 304 output from the injection locked frequency divider 303b, using the frequency divider 305, and measures each frequency of the reference signal 307 and the frequency-divided signal 306b which are input (S614).

The ILFD control unit 520 detects the locking range of the injection locked frequency divider 303b, based on the measurement result of the clock counter 550 in step S614 (S616).

Figure 6:
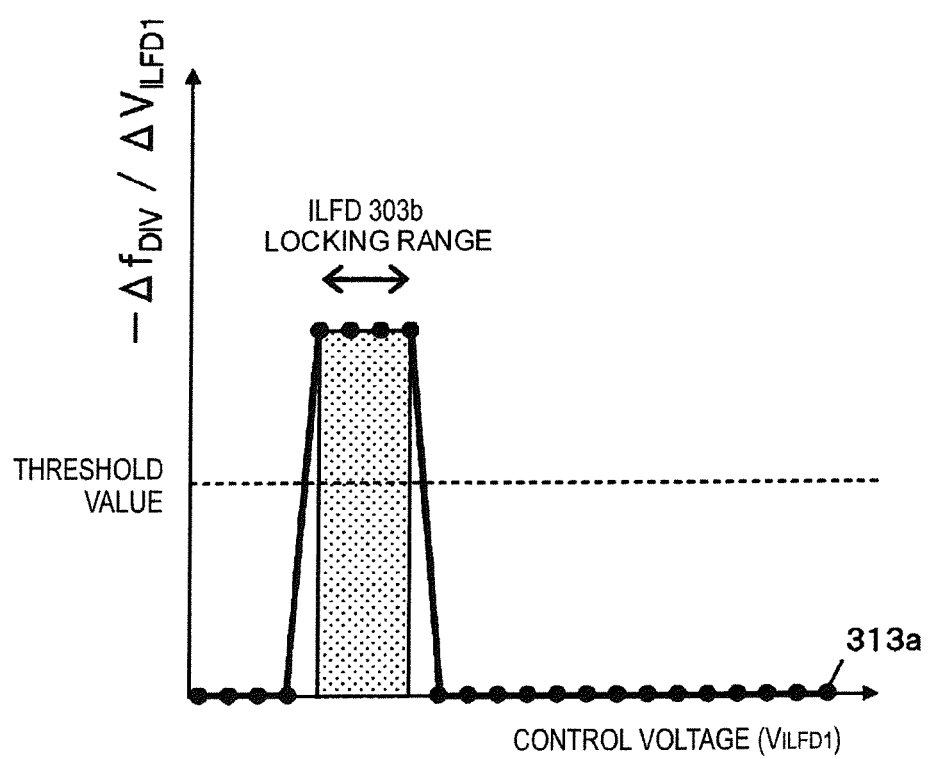
FIG. 6 is a graph illustrating frequency of an output signal which is obtained by frequency-dividing a free running signal output from an injection locked frequency divider 303a in response to a control voltage, to the neighborhood of a reference signal frequency using an injection locked frequency divider 303b and a frequency divider 305.

FIG. 6 is a graph illustrating frequency of an output signal which is obtained by frequency-dividing a free running signal output from then injection locked frequency divider 303a in response to the control voltage, to the neighborhood of the reference signal frequency using the injection locked frequency divider 303b and the frequency divider 305. A horizontal axis in FIG. 6 denotes the control voltage ($V_{ILFD1}$) of the injection locked frequency divider 303a and a vertical axis in FIG. 6 denotes the frequency difference ($-\Delta f_{DIV}/\Delta V_{ILFD1}$) of the output signal from the frequency divider 305 with respect to a change amount of the control voltage of the injection locked frequency divider 303a.

In FIG. 6, while the frequency difference ($-\Delta f_{DIV}/\Delta V_{ILFD1}$) of the output signal from the frequency divider 305 exceeds a predetermined threshold value, the injection locked frequency divider 303b does not output the free running signal as the voltage controlled oscillator and operates as a frequency divider synchronous to an input (injection) of the output signal from the injection locked frequency divider 303a. Namely, in FIG. 6, while the frequency difference ($-\Delta f_{DIV}/\Delta V_{ILFD1}$) of the output signal from the frequency divider 305 exceeds a predetermined threshold value, the injection locked frequency divider 303b operates within the locking range.

In the second embodiment, a central value of the locking range of the injection locked frequency divider 303b which is detected in step S616 is set as a set value of the control voltage of the injection locked frequency divider 303a. Namely, the ILFD control unit 520 stores in the lookup table 315 the control voltage (control parameter) of the injection locked frequency divider 303a which is the central value of the locking range of the injection locked frequency divider 303b detected in step S616 (S618). The control voltage value of the injection locked frequency divider 303a is denoted as $V_{ILFD1}$. Thereby, the calibration of the injection locked frequency divider 303a using the calibration circuit 314 is completed.

(VCO Calibration)

In FIG. 5, since the calibration of the VCO 301 in steps S424 to S430, namely the setting procedure of selecting the oscillation band of the VCO 301 for obtaining the output signal (first local signal, second local signal) of the desired frequency is the same as that of the first embodiment, their descriptions are omitted.

Thereby, even in a case where compensated values for a process variation of the injection locked frequency dividers 303a and 303b and a variation of the conditions which include the power supply voltage and the ambient temperature are unequal, the PLL circuit 300 according to the second embodiment enables the injection locked frequency dividers 303a and 303b to correctly operate within each locking range.

Thus, the PLL circuit 300 according to the second embodiment appropriately sets the oscillation band of the VCO 301, whereby it is possible to more stably obtain the desired frequency.

As described above, various embodiments have been described by referring to the drawings, but it is needless to say that the present disclosure is not limited to these embodiments. It is manifest that those skilled in the art can conceive various alteration examples or modification examples within a category described in connection with the claims, and it is understood that the alteration examples or the modification examples naturally fall within a technical scope of the disclosure.

In the first embodiment described above, the VCO control unit 510 outputs to the VCO 301 the on-off signal 316 for stopping the VCO 301 so as to stop the VCO 301.

For example, in order to stop the VCO 301, a switch is installed between the VCO 301 and the injection locked frequency divider 303a, and the VCO control unit 510 may output the VCO on-off signal 316 to the switch. Thereby, the switch disconnects the VCO 301 from the injection locked frequency divider 303a. Namely, the output signal 302 from the VCO 301 is not input to the injection locked frequency divider 303a, and this is substantially the same as the stop of the VCO 301 as described in the first embodiment.

In addition, the present application is based on Japanese Patent Application (Japanese Patent Application No. 2012-064339) filed on Mar. 21, 2012, the content of which are incorporated by reference.

Industrial Applicability

The present disclosure is applicable to a PLL circuit used in a mobile communication apparatus and is useful for, particularly, a PLL circuit using an injection locked frequency divider capable of frequency-dividing a frequency signal of 10 GHz or more, a calibration method, and a wireless communication apparatus.

REFERENCE SIGNS LIST 50a transmission mixer
50b reception mixer
300 PLL circuit
301 voltage controlled oscillator
303a, 303b injection locked frequency divider
305 frequency divider
308a phase and frequency detector
308b charge pump
309 electric current
310 loop filter
314 calibration circuit
315 lookup table
400 modulation unit
500 demodulation unit
510 VCO control unit
520 ILFD control unit
521a, 521b bias generation circuit
530 PFD-CP control unit
540 loop filter control unit
550 clock counter
1000 wireless communication apparatus

The invention claimed is:
1. A PLL circuit comprising:
a voltage controlled oscillator that outputs a high frequency signal;
a first injection locked frequency divider that frequency-divides the output high frequency signal;

a second injection locked frequency divider that frequency-divides the signal which is frequency-divided by the first injection locked frequency divider;

a frequency divider that frequency-divides a signal which is frequency-divided by the second injection locked frequency divider to frequency of a reference signal;

a phase and frequency detector that compares a frequency-divided signal output from the frequency divider with the reference signal and outputs errors of phase and frequency;

a charge pump that converts the output errors of the phase and frequency into an electric current;

a loop filter that generates a control voltage of the voltage controlled oscillator in response to the converted electric current, and applies the generated control voltage to the voltage controlled oscillator; and a calibration circuit that adjusts an oscillation band setting an oscillation frequency of the voltage controlled oscillator and control parameters for operating the first and second injection locked frequency dividers in predetermined operation bands different from each other, wherein the calibration circuit adjusts a control parameter of the first injection locked frequency divider by adjusting a control parameter of the second injection locked frequency divider, and thereafter adjusts the oscillation band of the voltage controlled oscillator in response to the adjusted frequency-divided signal of the second injection locked frequency divider.

2. The PLL circuit according to claim 1, wherein the calibration circuit further includes:

a VCO control unit which controls an operation of the voltage controlled oscillator; and an ILFD control unit which controls each operation of the first and second injection locked frequency dividers; and wherein the VCO control unit stops the voltage controlled oscillator when the ILFD control unit adjusts the control parameter of the first injection locked frequency divider.

3. The PLL circuit according to claim 2, wherein the calibration circuit further includes a clock counter which measures each frequency of the reference signal and a frequency-divided signal output from the frequency divider, which is frequency-divided in response to a control signal including the control parameter of the second injection locked frequency divider; and wherein the ILFD control unit sets the control parameter of the second injection locked frequency divider when each frequency of the measured reference signal and the measured frequency-divided signal are different from each other.

4. The PLL circuit according to claim 3, wherein the ILFD control unit sets a set value of the control parameter of the first injection locked frequency divider by adding an initial value of the control parameter of the first injection locked frequency divider to the control parameter of the second injection locked frequency divider which has been adjusted.

5. The PLL circuit according to claim 2, wherein the calibration circuit further includes a clock counter which measures each frequency of the reference signal and a frequency-divided signal output from the frequency divider, which is frequency divided in response to a control signal including the control parameter of the second injection locked frequency divider; and wherein the ILFD control unit continuously sweeps the control parameter of the first injection locked frequency divider, and sets the control parameter of the first injection locked frequency divider, based on a frequency difference of the frequency-divided signal output from the frequency divider according to a change amount of the control parameter of the first injection locked frequency divider.

6. The PLL circuit according to claim 3, wherein the VCO control unit releases the stop of the voltage controlled oscillator and selects the oscillation band setting the oscillation frequency of the voltage controlled oscillator, after the setting of the control parameter of the first injection locked frequency divider.

7. The PLL circuit according to claim 6, wherein the VCO control unit selects another oscillation band of the voltage controlled oscillator, in a case where each frequency of the reference signal and the frequency-divided signal which is obtained by frequency-dividing a signal output from the voltage controlled oscillator by using the first and second injection locked frequency dividers and the frequency divider in response to the selected oscillation band are different from each other.

8. The PLL circuit according to claim 6, wherein the VCO control unit selects the oscillation band of the voltage controlled oscillator, based on each frequency of the reference signal and the frequency-divided signal which is obtained by frequency-dividing the signal output from the voltage controlled oscillator by using the first and second injection locked frequency dividers and the frequency divider in response to the selected oscillation band.

9. The PLL circuit according to claim 7, further comprising:

a lookup table which stores the oscillation band of the voltage controlled oscillator and stores the control parameters of the first and second injection locked frequency dividers, when the frequency difference between the reference signal and the frequency-divided signal, which is obtained by frequency-dividing the signal output from the voltage controlled oscillator by using the first and second injection locked frequency dividers and the frequency divider, is a predetermined amount or less.

10. The PLL circuit according to claim 8, further comprising:

a lookup table which stores the oscillation band of the voltage controlled oscillator and stores the control parameters of the first and second injection locked frequency dividers, when the frequency difference between the reference signal and the frequency-divided signal, which is obtained by frequency-dividing the signal output from the voltage controlled oscillator by using the first and second injection locked frequency dividers and the frequency divider, is a predetermined amount or less.

11. The PLL circuit according to claim 5, wherein the VCO control unit releases the stop of the voltage controlled oscillator and selects the oscillation band setting the oscillation frequency of the voltage controlled oscillator, after the setting of the control parameter of the first injection locked frequency divider.

12. The PLL circuit according to claim 11, wherein the VCO control unit selects another oscillation band of the voltage controlled oscillator, in a case where each frequency of the reference signal and the frequency-divided signal which is obtained by frequency-dividing a signal output from the voltage controlled oscillator by using the first and second injection locked frequency dividers and the frequency divider in response to the selected oscillation band are different from each other.

13. The PLL circuit according to claim 11, wherein the VCO control unit selects the oscillation band of the voltage controlled oscillator, based on each frequency of the reference signal and the frequency-divided signal which is obtained by frequency-dividing the signal output from the voltage controlled oscillator by using the first and second injection locked frequency dividers and the frequency divider in response to the selected oscillation band.

14. The PLL circuit according to claim 12, further comprising:
a lookup table which stores the oscillation band of the voltage controlled oscillator and stores the control parameters of the first and second injection locked frequency dividers, when the frequency difference between the reference signal and the frequency-divided signal, which is obtained by frequency-dividing the signal output from the voltage controlled oscillator by using the first and second injection locked frequency dividers and the frequency divider, is a predetermined amount or less.

15. The PLL circuit according to claim 13, further comprising:
a lookup table which stores the oscillation band of the voltage controlled oscillator and stores the control parameters of the first and second injection locked frequency dividers, when the frequency difference between the reference signal and the frequency-divided signal, which is obtained by frequency-dividing the signal output from the voltage controlled oscillator by using the first and second injection locked frequency dividers and the frequency divider, is a predetermined amount or less.

16. A wireless communication apparatus comprising:
the PLL circuit according to claim 1;
a modulation unit that modulates a base band transmission signal;
a transmission mixer that frequency-converts into a carrier frequency based on a first local signal output by the PLL circuit and the modulated transmission signal;
a reception mixer that frequency-converts into a base band based on a second local signal output by the PLL circuit and a reception signal; and
a demodulation unit that demodulates the frequency-converted reception signal.

17. A calibration method of a PLL circuit which connects with a first injection locked frequency divider and a second injection locked frequency divider, the calibration method comprising:
a step of stopping each operation of a voltage controlled oscillator outputting a high frequency signal and the first injection locked frequency divider;
a step of measuring each frequency of a predetermined reference signal and a frequency-divided signal which is frequency-divided by a frequency divider in response to a control signal including a control parameter of the second injection locked frequency divider;
a step of setting the control parameter of the second injection locked frequency divider, based on each frequency of the measured frequency-divided signal, which is frequency-divided by the frequency divider, and the predetermined reference signal;
a step of releasing the stop of the first injection locked frequency divider;
a step of measuring each frequency of the predetermined reference signal and the frequency-divided signal which is frequency-divided by the second injection locked frequency divider and the frequency divider in response to a control signal including a control parameter of the first injection locked frequency divider;
a step of setting the control parameter of the first injection locked frequency divider, based on each frequency of the measured frequency-divided signal, which is frequency-divided by the second injection locked frequency divider and the frequency divider, and the predetermined reference signal;
a step of releasing the stop of the voltage controlled oscillator;
a step of selecting an oscillation band setting an oscillation frequency of the voltage controlled oscillator; and
a step of selecting the oscillation band of the voltage controlled oscillator based on each frequency of the predetermined reference signal and a frequency-divided signal which is obtained by frequency-dividing a signal output from the voltage controlled oscillator by using the first and second injection locked frequency dividers and the frequency divider in response to the selected oscillation band.

* * * * *